(12) United States Patent
Guo et al.

(10) Patent No.: US 8,883,523 B2
(45) Date of Patent: Nov. 11, 2014

(54) METHOD FOR DETECTING PATTERN OFFSET AMOUNT OF EXPOSED REGIONS AND DETECTING MARK

(75) Inventors: Jian Guo, Beijing (CN); Weifeng Zhou, Beijing (CN); Xing Ming, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 504 days.

(21) Appl. No.: 13/107,064

(22) Filed: May 13, 2011

(65) Prior Publication Data
US 2011/0279132 A1  Nov. 17, 2011

(30) Foreign Application Priority Data

May 14, 2010  (CN) .......................... 2010 1 0175934

(51) Int. Cl.
*G01R 31/26* (2014.01)
*G01R 27/26* (2006.01)
*G03F 7/20* (2006.01)

(52) U.S. Cl.
CPC ........ *G03F 7/70658* (2013.01); *G03F 7/70633* (2013.01); *G03F 7/70683* (2013.01)
USPC ........................................... 438/18; 324/679

(58) Field of Classification Search
USPC ................ 297/797; 438/401, 462, 10, 13–14, 438/17–18
See application file for complete search history.

(56) References Cited

U.S. PATENT DOCUMENTS

| | | | |
|---|---|---|---|
| 5,861,679 A | 1/1999 | Nagano | |
| 2006/0228651 A1* | 10/2006 | Tajima et al. | 430/312 |
| 2008/0217613 A1 | 9/2008 | Oshida | |
| 2010/0310836 A1* | 12/2010 | Nikolski et al. | 428/195.1 |
| 2011/0250710 A1* | 10/2011 | Renn | 438/17 |

FOREIGN PATENT DOCUMENTS

| | | |
|---|---|---|
| JP | 03-270211 A | 12/1991 |
| JP | 11-023668 A | 1/1999 |
| JP | 2000-252340 A | 9/2000 |
| JP | 2001-093818 A | 4/2001 |
| JP | 2003-172601 A | 6/2003 |
| JP | 2008-283051 A | 11/2008 |
| JP | 2010-114130 A | 5/2010 |
| KR | 20090013114 A | 2/2009 |

OTHER PUBLICATIONS

KIPO NOA dated May 31, 2013; Appln. No. 10-2011-0045002.
Third Chinese Office Action dated Jan. 26, 2014; Appln. No. 201010175934.0.
Japanese Office Action dated Nov. 19, 2013; Appln. No. JP2011-109314.
Chinese Rejection Decision dated Aug. 8, 2014; Appln, No. 201010175934.0.

* cited by examiner

*Primary Examiner* — Charles Garber
*Assistant Examiner* — Brigitte Paterson
(74) *Attorney, Agent, or Firm* — Ladas & Parry LLP

(57) ABSTRACT

A method for detecting a patter offset amount of exposed regions comprises forming at least one pair of conductive detecting marks with a predetermined position relationship by a patterning process including two exposing processes; detecting an electrical characteristic of the at least one pair conductive detecting marks, if the detected electrical characteristic does not meet a predetermined position relationship, it is determined that the pattern offset amount of the exposed regions in two exposure steps is not qualified; and if the detected electrical characteristic meets the predetermined position relationship, it is determined that the pattern offset amount of the exposed regions in two exposure steps is qualified.

10 Claims, 7 Drawing Sheets

(a)

(b)

METHOD FOR DETECTING PATTERN OFFSET AMOUNT OF EXPOSED REGIONS AND DETECTING MARK

BACKGROUND

Embodiments of the present invention relates to a method for detecting a pattern offset amount of exposed regions and a detecting mark.

Thin film transistor liquid crystal displays (TFT-LCDs) have the advantages of small volume, low power consumption, low radiation and the like, and thus have predominated in the current flat plate display market.

A TFT-LCD is formed by bonding an array substrate and a color filter substrate together. On the array substrate, gate lines and signal lines are formed to intersect with one another so as to define pixel regions, and a pixel electrode and a thin film transistor are arranged in each pixel region.

In the current manufacturing processes of a TFT-LCD, the different regions in the same structure layer sometimes need to be respectively exposed, and at this time, a pattern offset amount of exposed regions in the same structure layer need to be detected so as to ensure the uniform arrangement of patterns of the exposed regions.

In one detecting or testing process as shown in FIG. 1, when a first region 1 is exposed, besides photoresist patterns for a array structure are formed, a sets of photoresist patterns 2 not exposed are simultaneously formed for detecting marks in the periphery of the first region 1, and shape of the photoresist patterns 2 may be a rectangle, a circle and the like (as shown in FIG. 1(a)). Then, when a second region 3 is exposed in the same layer, besides that photoresist patterns for the array structure are formed in the second region 3, the patterns 2 formed in the previous exposure process are again exposed so as to form photoresist patterns 4 subject to exposure and each slightly smaller than patterns 2 (as shown in FIG. 1(b)). When a pattern offset amount between the two exposing processes is in a specified range, the patterns 4 are located inside of the patterns 2, and after the photoresist is developed, the patterns 4 and 2 form ring shape structures. Pattern offset amounts at the upper portion, the lower portion, the left portion and the right portion of each ring shape structure can be respectively detected by a microscope, a camera, an image processing device and the like, and thus, the pattern offset amount can be determined.

However, it takes long time to detect the pattern offset amount of exposed regions in the above process, and thus a full detection of a glass substrate is difficult to be achieved, a missing detection easily occurs, and a defective product may unintentionally enter subsequent processes.

SUMMARY

An embodiment of the present invention relates to a method for detecting a patter offset amount of exposed regions, comprising: forming at least one pair of conductive detecting marks with a predetermined position relationship by a patterning process including two exposing processes; detecting an electrical characteristic of the at least one pair conductive detecting marks, if the detected electrical characteristic does not meet a predetermined position relationship, it is determined that the pattern offset amount of the exposed regions in two exposure steps is not qualified; and if the detected electrical characteristic meets the predetermined position relationship, it is determined that the pattern offset amount of the exposed regions in two exposure steps is qualified.

Another embodiment of the present invention relates to a detecting mark for detecting a pattern offset amount of exposed regions, comprising: a conductive first detecting mark and a conducive second detecting mark, disposed in pair at a periphery region of the exposed regions, wherein the first detecting mark and the second detecting mark are located in the same layer, and the first detecting mark and the second detecting mark are spaced a specified distance from each other and are insulated from each other.

Further another embodiment of the invention provides a detecting mark for detecting a pattern offset amount of exposed regions, comprising: a conductive first detecting mark and a conducive second detecting mark, disposed in pair at a periphery region of the exposed regions in different layers; and an insulating layer interposed between the first detecting mark and the second detecting mark; wherein the first detecting mark and the second detecting mark are located at a predetermined relative position in the different layers.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION

Some embodiments of the invention will be described hereinafter with reference to the accompanying drawings. Obviously, the embodiments to be described are only a part but not all of the embodiments of the invention. All other embodiments obtained by those skilled in the relevant technical field based on the described embodiments without inventive work should be included in the scope of the present invention.

A method for detecting a pattern offset amount of exposed regions according to one embodiment of the present invention comprises:

S201, forming at least one pair of conductive detecting marks having a predetermined position relationship by a patterning process including two exposing processes.

S202, detecting an electric characteristic of the at least one pair of conductive detecting marks, and if the detected electric characteristic does not meet a predetermined position relationship, it is determined that the pattern offset amount of exposed regions in the two exposing processes is not qualified; if the electric characteristic meets the predetermined position relationship, it is determined that the pattern offset amount of exposed regions in two exposing processes is qualified.

In the method for detecting pattern offset amount of exposed regions provided by the present embodiment, the pattern offset amount in exposing processes is detected by means of electric characteristic, and thus the detection can be performed rapidly and in real-time, the full detection on a substrate can be achieved, and the defect detection rate and yield can be improved.

A patterning process typically includes depositing a thin film, applying photoresist on the thin film, exposing and developing of the photoresist, etching the thin film by using formed photoresist mask, removing remaining photoresist, and etc.

With regarding to the method for detecting pattern offset amount of exposed regions according to the present embodiment, detection of a pattern offset amount of a plurality of exposure regions in a same layer is described as an example, and the exemplary method comprises:

S301, sequentially forming a conductive thin film and a photoresist layer on a substrate. This photoresist layer is used to pattern the conductive thin film so as to form a required circuit pattern and the like.

S302, exposing a first region of the photoresist layer and a periphery region of the first region, a photoresist pattern which is not exposed in the periphery region of the first region includes a pattern corresponding to at least one first detecting mark.

Figure 1:
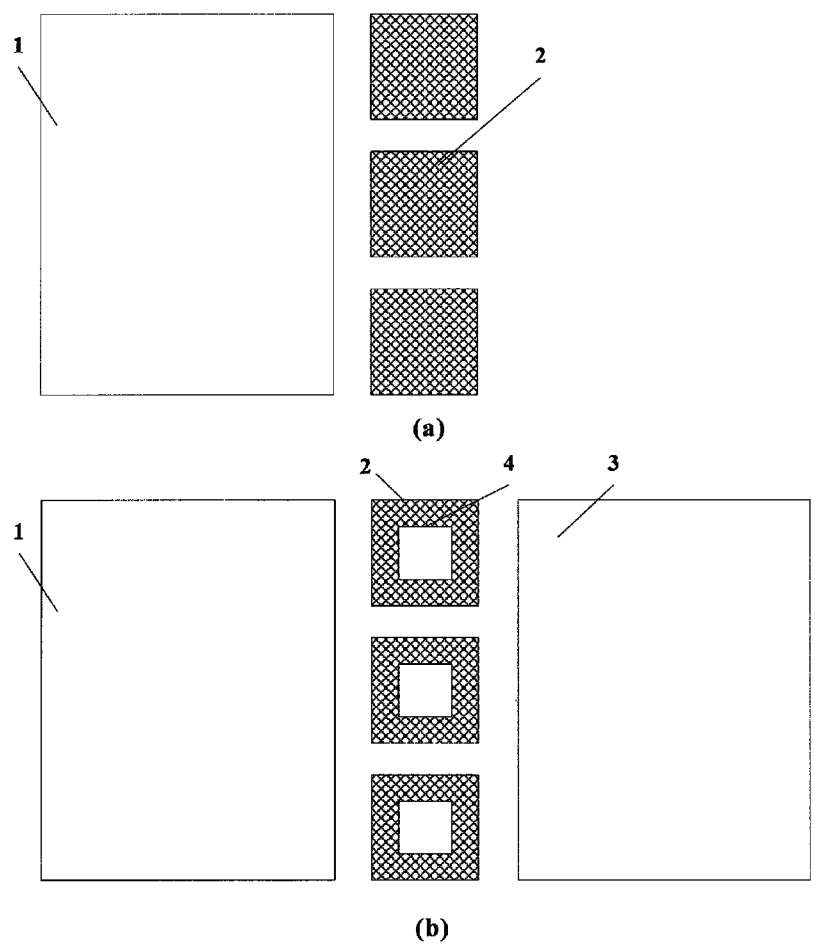
FIGS. 1 (a) and (b) are schematic views for showing a detecting of pattern offset amount of exposed regions in the related art.
Figure 2:
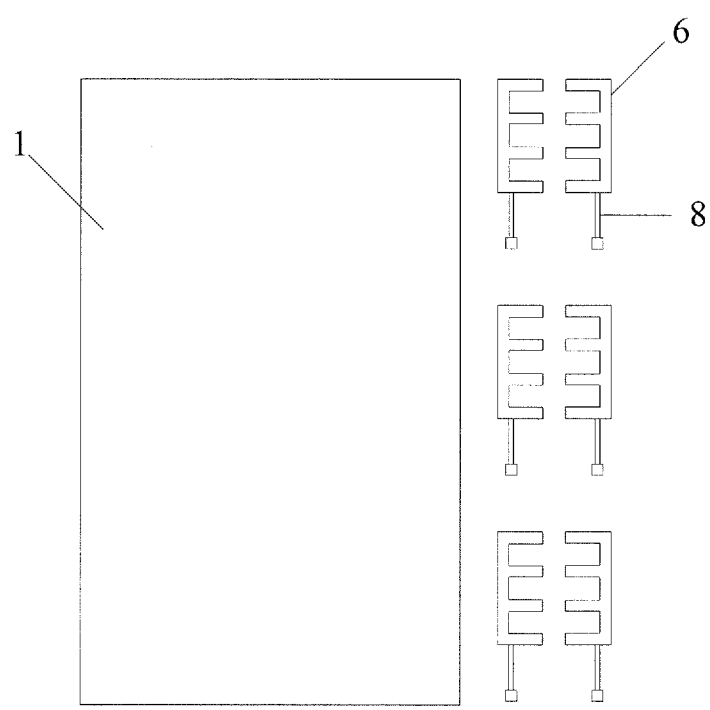
FIG. 2 is a forming schematic view of a first detecting mark according to embodiments of the present invention.

As shown in FIG. 2, when the first region 1 is exposed, the photoresist patterns not exposed at an upper portion, a middle portion and a lower portion of a periphery (in present embodiment, only a right side is shown) of the first region 1 have three zigzag shape patterns for the first detecting marks 6. Each of the first detecting marks 6 includes a left part and a right part disposed separately, and the first detecting mark 6 cab further include a connection terminal 8 used to apply a testing current.

S303, exposing a second region of the photoresist layer and a periphery region of the second region, and a photoresist pattern which is not exposed in the periphery region of the second region includes a pattern corresponding to at least one second detecting mark, wherein a pattern of one first detecting mark and a pattern of one second detecting mark are disposed in pair and are spaced a specified distance from each other according to a design requirement.

Figure 3:
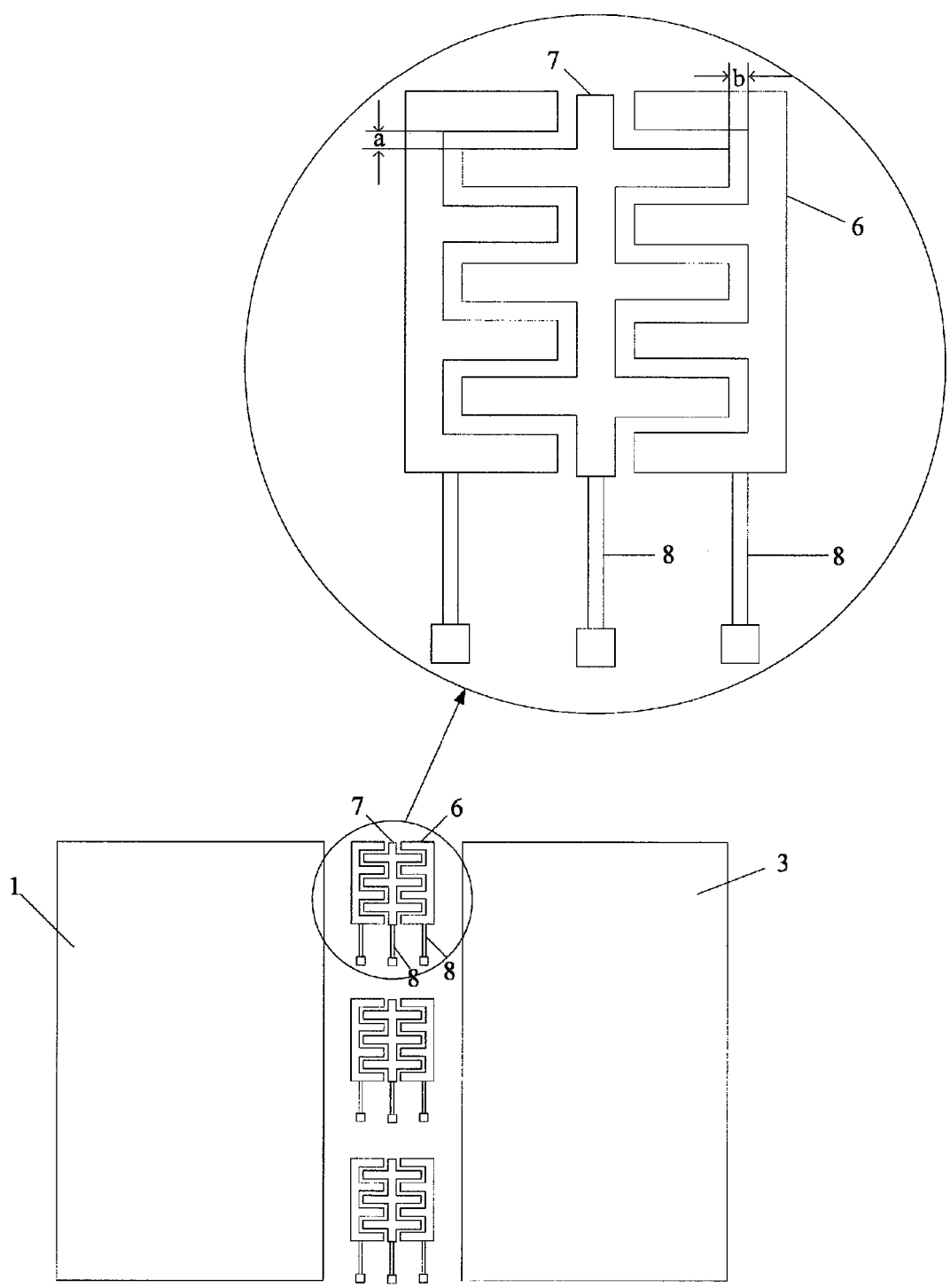
FIG. 3 is a forming schematic view of a second detecting mark according to embodiments of the present invention.

Based on the FIG. 2, as showing in FIG. 3, when a second region 3 of the same photoresist layer is exposed, and a photoresist pattern which is not exposed in the periphery region of the second region includes a "丰" (of Chinese character) shaped pattern for one second detecting mark 7 to used to achieve the second detecting mark 7 in a "丰" shape. Each "丰" shaped pattern is in connection with the pattern of one first detecting mark 6 and is spaced a specified distance from the pattern of this first detecting mark 6. In the example as shown, the patterns for the second detecting marks 7 also include three patterns located at the upper portion, the middle portion and the lower portion respectively, and one of the three patterns forms one pair with one photoresist pattern for the first detecting marks 6, and is located between the left part and the right part, disposed oppositely, of the photoresist pattern of the first detecting mark 6, and thus each resultant second detecting mark 7 is surrounded by the corresponding first detecting mark 6. The second detecting mark 7 also can further have a connection terminal 8 for supplying a detecting current. According to the design requirement, the pattern of the second detecting mark 7 and the pattern of the first detecting mark 6 are not connected to each other, and a longitudinal predetermined interval "a" and a transverse predetermined interval "b" between them are both set according to the technical standard. In practice, if a pattern offset amount of two exposing processes does not meet the requirement, the pattern of the second detecting mark 7 may be connected to the pattern of the first detecting mark 6.

S304, after developing the photoresist, etching the conductive thin film and removing the photoresist on the substrate, the first and second detecting marks formed of the conductive thin film are obtained.

With regard to the detecting marks, firstly, the exposed photoresist layer is developed so as to remove the exposed portions of the photoresist layer, and only the photoresist patterns for the detecting marks, which are not exposed, are remained; then, the underlying conductive thin film is etched by using the photoresist patterns as an etching mask to etch out the portions not covered by the photoresist of the conductive thin film, and only the portions covered by photoresist and for the detecting marks of the conductive thin film are remained; finally, the photoresist patterns are removed, the photoreist covering the etched conductive thin film is removed such that the conductive first and second detecting marks are obtained. According to the design requirement, each first detecting mark and the corresponding second detecting mark are insulated from each other; however, if a pattern offset amount of two exposing processes does not meet the design requirement, the first detecting mark and the second detecting mark may be connected to each other.

S305, performing detection by supplying current to the conductive first and second detecting marks, and if the current flows between the first detecting marks and the second detecting marks, it is determined that a pattern offset amount between the first region and the second region is not qualified; if the first detecting mark and the second detecting mark are insulated from each other, it is determined that the pattern offset amount of between the first region and the second region is qualified.

More specifically, when a pattern offset amount of two continuous exposing processes for the different regions is in the range of a specified standard, the first detecting marks 6 and the second detecting marks 7 are insulated from each other, and at this time, if current is applied to the connection terminal 8 of one first detecting mark 6, the current cannot be detected out at the connection terminal 8 of the corresponding second detecting mark 7; and if current is applied to the connection terminal 8 of one second detecting mark 7, the current cannot be detected out at the connection terminal 8 of the corresponding first detecting mark 6 as well.

On the contrary, if the pattern offset amount of two continuous exposing processes is not qualified and out of the standard range, portions of the first detecting marks 6 and the second detecting marks 7 along a certain direction overlaps with each other, which makes the first detecting marks 6 and the second detecting marks 7 electrically connected with each other. At this time, if current is applied to the connection terminal 8 of one first detecting mark 6, current can be detected out at the connection terminal 8 of the corresponding second detecting mark 7; and if current is supplied to the connection terminal 8 of one second detecting mark 7, the current can be detected out at the connection terminal 8 of the corresponding first detecting mark 6 as well.

In the method for detecting a pattern offset amount of exposed regions according to the present embodiment, two exposing processes are used to expose different regions on the substrate, and then a developing process, an etching process and a removing process are used to form at least a pair of conductive detecting marks which should be insulated from each other, and current is applied to the pair of detecting marks to perform detection, if the detecting marks expected to be insulated from each other are electrically connected to each other, it means that a pattern offset amount of the two exposed regions is not qualified; if the detecting marks exposed to be insulated from each other are certainly insulated from each other, it means that the pattern offset amount of the two exposed regions is qualified. The pattern offset amount of exposed regions in the same layer is detected by means of current, and thus the detection is performed rapidly and in real-time, the full detection on a substrate can be achieved and the defect detection rate and yield can be improved.

In the above mentioned embodiments, a kind of positive photoresist is used, wherein the exposed photoresist is removed and the photoresist not exposed is remained during the development process. However, in the embodiments of the present invention, the photoreist may be a kind of negative photoresist, wherein the exposed photoreist is remained and the photoresist not exposed is removed during the development process, and thus the photoresist patterns corresponding to the first and second detecting marks are exposed, which is opposite to the above mentioned positive photoresist.

Figure 4:
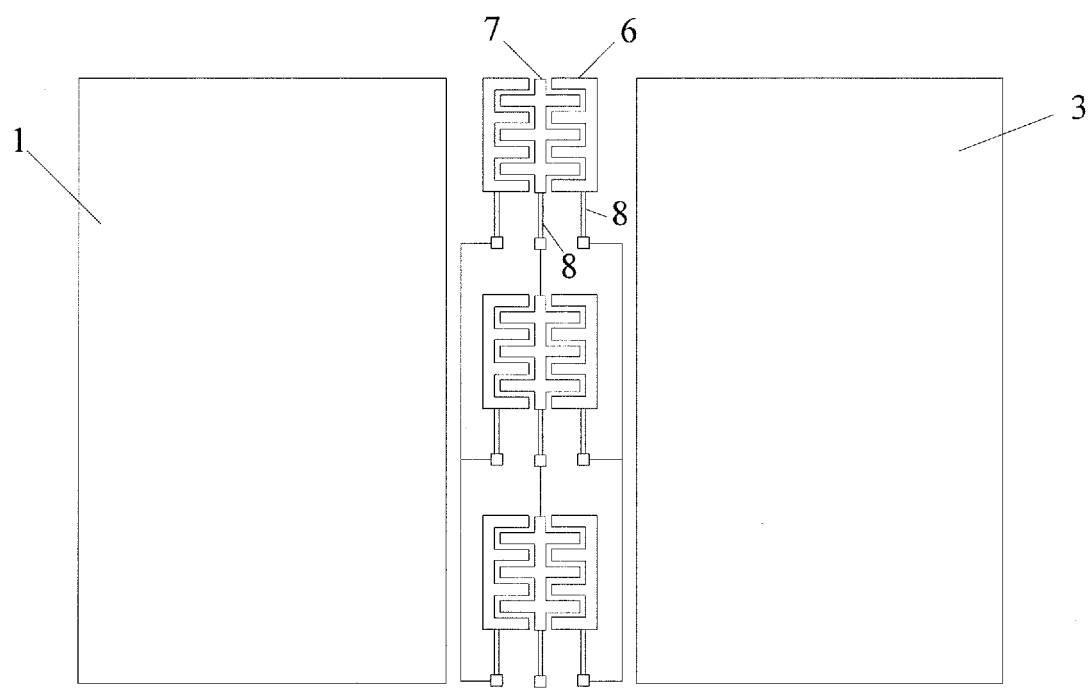
FIG. 4 is a schematic view of a detecting mark according to embodiments of the present invention.

In addition, as shown in FIG. 4, all of the conductive first detecting marks 6 formed between the first region 1 and the second region 3 may be electrically connected together, and correspondingly, all of the conducting second detecting marks 7 may be electrically connected together. Thus, current is applied to any one pair of the first detecting mark 6 and the second detecting mark 7 to perform detection so as to obtain a pattern offset amount of the first region 1 and the second region 3, which is more rapid than a separate detection in the above embodiment.

Further, for the entire glass substrate, all or a portion of the first detecting marks thereon may be electrically connected together and led to an edge of the substrate by a lead wire. Correspondingly, all of a portion of the second detecting marks may be electrically connected together and led to an edge of the substrate.

Figure 5:
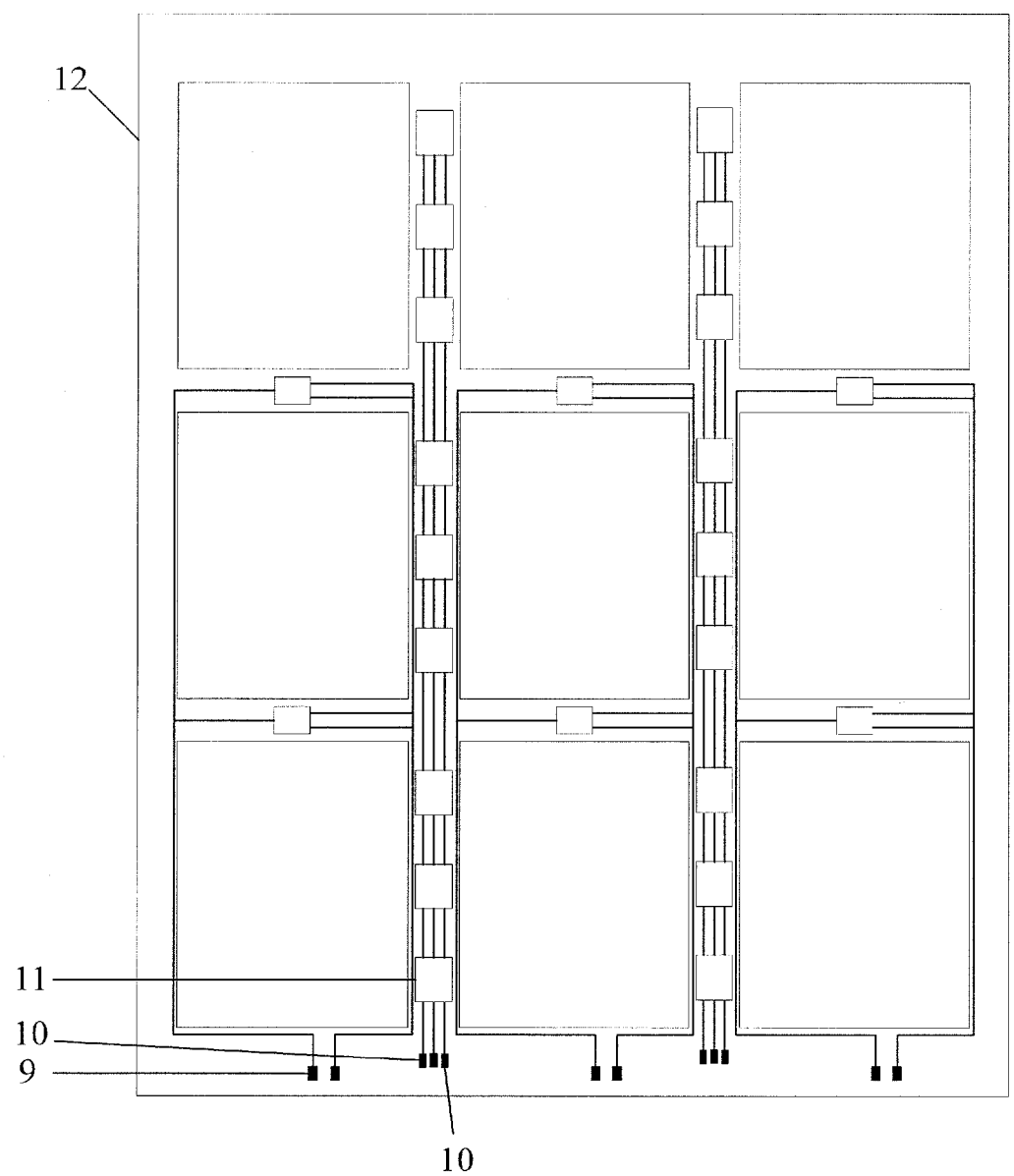
FIG. 5 is a schematic view of a detecting mark of a substrate according to embodiments of the present invention.

As shown in FIG. 5, connection terminals of all of the longitudinal and transverse detecting marks 11 on a glass substrate 12 are electrically connected together and led to an edge of the glass substrate 12. All of the first detecting marks 6 may be electrically connected together and led to an edge pin 9 of the glass substrate 12, or the first detecting marks 6 may be connected together and separately led to an edge pin 10 of the glass substrate 12. The detection functions can be performed identically in the above two cases.

Current is introduced into a pin at an edge of the glass substrate 12, and thus, a pattern offset amount of longitudinal exposed regions and a pattern offset amount of transverse exposed regions can be conveniently detected out, and the detection can be rapidly and more easily performed.

A portion of the detection marks on the glass substrate are connected together, as an example, to explain the present embodiment, but all of the detecting marks may be connected to one another, that is, all of the first detecting marks 6 may be connected together and led to an edge of the substrate, and all of the second detecting marks 7 may also be connected together and led to an edge of the substrate, and then, current is applied to perform detection.

Figure 6:
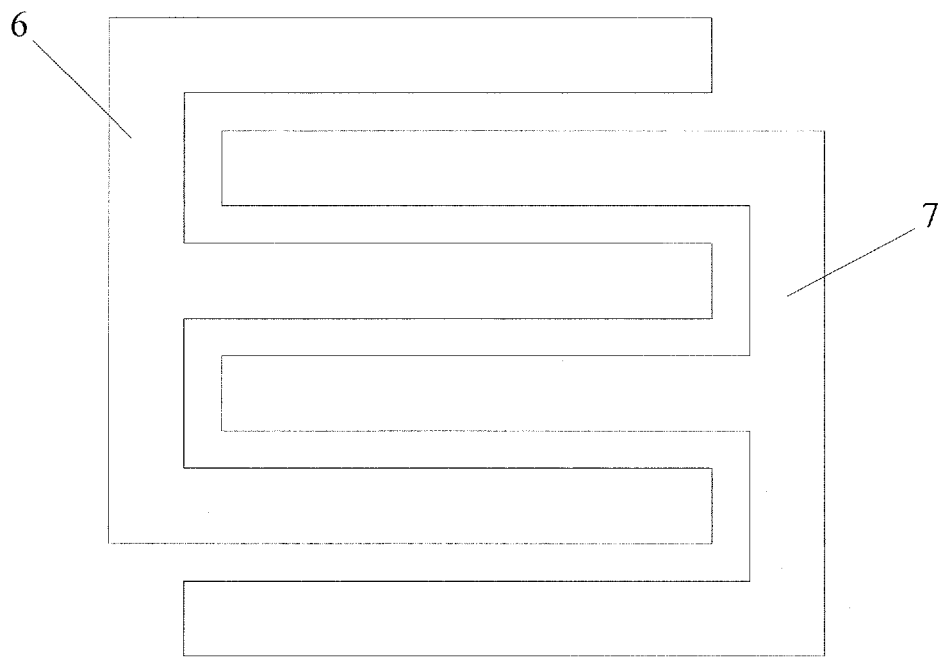
FIGS. 6 (a) and (b) are schematic views of detecting marks according to embodiments of the present invention.
Figure 6:
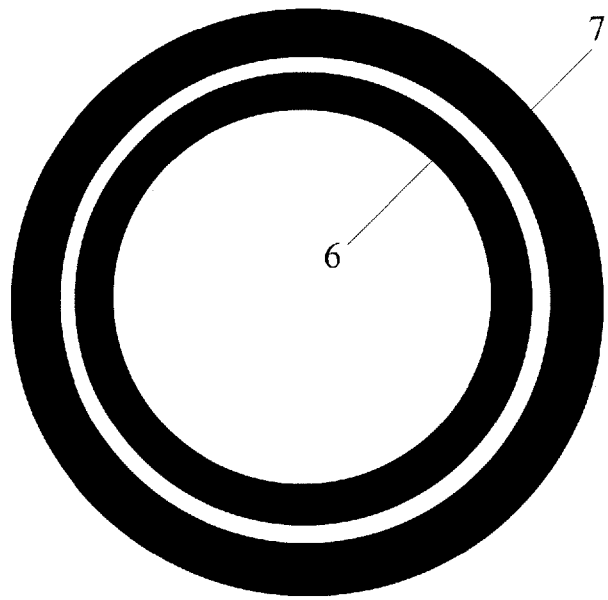

It is noted that patterns of the detecting mark 6 and 7 in the example only are the purpose of illustration, and the shape of the detecting marks is not limited to that as shown, but various changes can be made without departing from the spirit of the present invention. For example, the concave-convex complementary patterns spaced a specified distance from each other as show in FIG. 6 (a) can be used, in which a second detecting mark is partially surrounded by a first detecting mark; or, the concentric ring patterns as shown in FIG. 6 (b) can be used, in which a second detecting mark is surrounded by a first detecting mark.

A method for detecting a pattern offset amount of exposed regions according to the present embodiment may also be explained by taking detection of a pattern offset amount of exposing processes in the different layers as an example, and a method of the example comprises:

S901, sequentially forming a first conductive thin film and a first photoresist layer on a substrate. The first photoresist layer is used to pattern the underlying first conductive thin film to form a circuit pattern and the like.

S902, exposing the first photoresist layer in a first region of the substrate and a periphery region of the first region, and then developing the photoresist, etching the first conductive thin film and removing the photoresist, whereby at least one conductive first detecting mark is obtained in the periphery region of the first region.

With regard to a region in which the detecting marks are formed, and similarly to the above embodiment, firstly, the photoresist layer is developed, and the exposed portion of the photoresist is removed and only a portion not exposed and corresponding to the detecting mark patterns of the photoresist is remained. Then, the first conductive thin film is etched by using the resultant photoresist mask, and a portion, not covered by the photoreist, of the conducive thin film is etched out, and only a portion, covered by the photoresist pattern for the detecting mark, of the conductive thin film is remained. Finally, the remaining photoresist is removed, that is, the photoresist covering the etched conductive thin film is stripped away, and thus, at least one conductive first detecting mark is obtained.

S903, sequentially forming a second conductive thin film and a second photoresist layer in another layer on the substrate. The second photoresist layer is used to pattern the underlying second conductive thin film to form a circuit pattern and the like S904, exposing the second photoresist layer in the first region and a periphery region of the first region, and then developing the photoresist, etching the second conductive thin film and removing the photoresist, whereby at least one conductive second detecting mark which is in a pair with the first detecting mark is obtained in the periphery region of the first region, and an insulating layer is formed between the second detecting mark and the first detecting mark.

Herein, the detailed process for forming the second detecting mark is the same as that for forming the first detecting mark, so it is omitted.

Herein, there are two corresponding relationships between the second detecting mark and the first detecting mark.

Figure 7:
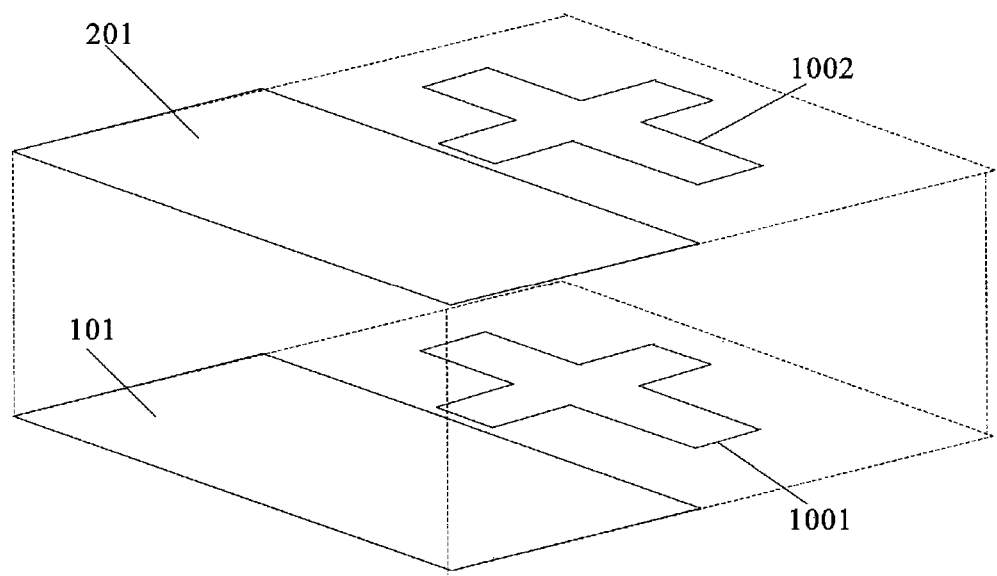
FIG. 7 is a schematic view for showing a corresponding relationship between the first detecting mark and the second detecting mark according to embodiments of the present invention.

The first corresponding relationship is shown in FIG. 7, in which a second detecting mark 1002 of a first region 201 in a second layer is completely overlapped with a first detecting mark 1001 of a first region 101 in a first layer, that is, an overlapping area of two detecting marks is at maximum at an initial stage.

Figure 8:
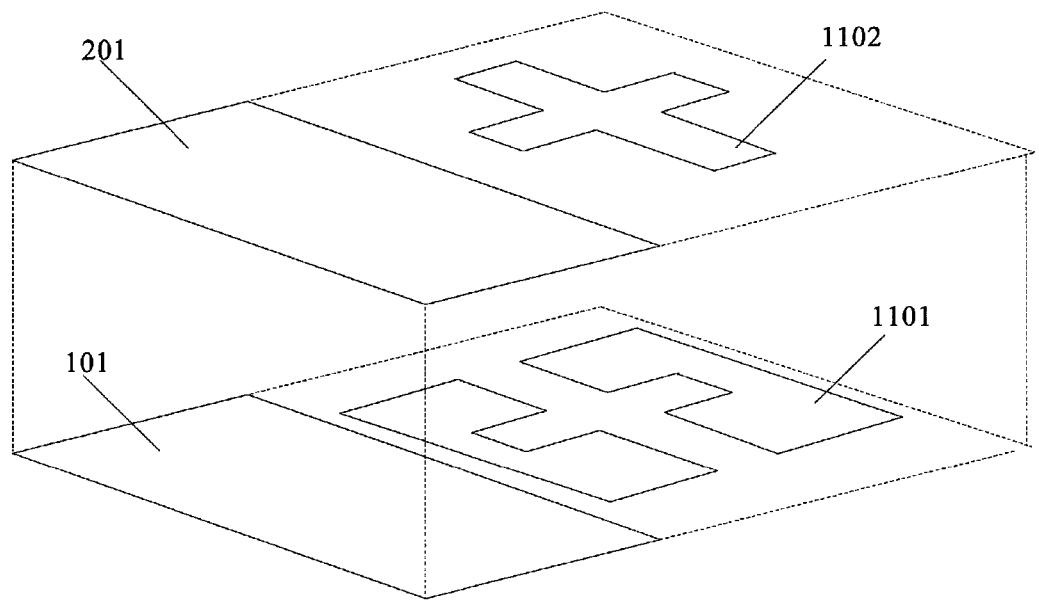
FIG. 8 is another schematic view for showing the corresponding relationship between the first detecting mark and the second detecting mark according to embodiments of the present invention.

The second corresponding relationship is shown in FIG. 8, in which a second detecting mark 1102 of a first region 201 in a second layer is not overlapped with a first detecting mark 1101 of a first region 101 in a first layer, that is, an overlapping area of two detecting marks is zero at an initial stage.

It should be noted that in FIGS. 7 and 8, the insulating layer between the two detecting marks is omitted for clarity.

S905, detecting capacitance between the first detecting mark and the second detecting mark, and if a difference between the capacitance and a specified value is within a specified range, it can be determined that a pattern offset amount between the first regions in the two layers is qualified, and if the difference between the capacitance and the specified value is out of the specified range, it can be determined that the pattern offset amount between the first regions in the two layers is not qualified.

Here, for detecting a pattern offset amount of exposing processes in the different layers, since conductive thin films in the different layers are isolated from each other by an insulating layer, current detection can not be performed in the manner described in the above embodiment. However, an alignment offset occurs between the positions of exposed regions in the different layers, a corresponding position of the first detecting mark and the second detecting mark changes, and an overlapping area of the first detecting mark and the second detecting mark may correspondingly increase or decrease. Thus, a pattern offset amount of exposed regions in two photoresist layers can be detected by means of capacitance.

More specifically, a calculating equation of capacitance is: $C=AS/d$, wherein "A" is a parameter related to medium, S is an overlapping area, and d is a distance between conductive thin films of the first detecting mark and the second detecting mark. When conductive thin films of each two layers are not overlapped with each other, the capacitance is very small and can be substantially omitted. When an alignment offset occurs between each two layers and an overlapping area S is generated, capacitance different can be detected out, and thus it can be determined whether the alignment offset occurs and to what degree the alignment offset is.

For example, with regarding to the first corresponding relationship as show in FIG. 7, at an initial stage, an overlapping area of the first detecting mark 1001 and the second detecting mark 1002 is at the maximum, that is, S in the equation is at the maximum, and capacitance of the formed capacitor is at the maximum at the initial stage (a specified value is set to A). When a pattern offset amount of exposed regions of two layers is zero or very slight, a change of the overlapping area of the two detecting marks is zero or very small, a detected capacitance is substantially similar to the specified value A, that is, a difference between the detected capacitance and the specified value A is within a specified range, and thus, it can be determined that a pattern offset amount of exposed regions in two layers is qualified. When a pattern offset amount of exposed regions in two layers is relatively large, a change of the overlapping area of the two detecting marks is relatively large, and thus, it can be determined that a pattern offset amount of exposed regions in two layers is not qualified.

With regarding to the second corresponding relationship shown in FIG. 8, an initial overlapping area of two detecting marks is at the minimum, and a principle thereof is the same as the second corresponding relationship, so it is omitted for simplicity. The detecting marks in the layers can be connected to each other by via holes.

In additional, each of the conductive first detecting marks at the periphery of the first region in a first layer may be connected to one another; and each of the conductive second detecting marks at the periphery of the first region in a second layer may be correspondingly connected to one another. Thus, by detecting capacitance between any one pair of the first and second detecting marks, a pattern offset amount of the first layer and the second layer can be obtained, which is more rapidly than the separate detection.

Further, for the entire glass substrate, all or a portion of the first detecting marks in the first layer may be electrically connected to one another and led to an edge of the substrate by a lead wire. Correspondingly, all of a portion of the second detecting marks may be electrically connected to one another and led to an edge of the substrate. Thus, the detection may be quicker and more convenient.

It should be noted that the detecting marks 1001, 1002, 1101, and 1102 in the present embodiment are given only as an example, and the detection marks are not limited thereto but may be varied without departing from the spirit of the present invention. For example, an upper and lower two detecting marks may be in concave-convex complementary patterns, concentric ring patterns or the like, as shown in FIGS. 6(*a*) and 6(*b*). In the above mentioned example, a kind of positive photoresist is still used as an example, but a kind of negative photoresist may be used.

In addition, pattern offset amount detection for two layers provided by the present embodiment can be performed separately, that is, detecting marks may be specially designed for this detection, and the above first corresponding relationship or the second corresponding relationship may be selected for the detecting marks.

Or, the detecting marks for detecting a pattern offset amount by using current in the same layer may be repeatedly used for detection of a pattern offset amount between different layers; that is, in each layer, the same detecting marks for current detection is formed, and after detection a pattern offset amount for the same layer is performed, detection of a pattern offset amount between different layers then is performed, and at this time, a relationship between the detecting marks in two layers can be the above first corresponding relationship. The related detecting marks may be similar to the above-described detecting marks 6 and 7, or may be similar to those shown in FIG. 4.

A detecting mark for detecting a pattern offset amount of exposed regions provided in embodiments of present invention are shown in FIG. 3, and the detecting marks includes a conductive first detecting mark 6 and a conductive second detecting mark 7 which are disposed in pair at a periphery region of the exposed regions 1 and 3. The first detecting mark 6 and the second detecting mark 7 are located in the same layer, and during the manufacturing process, the detecting mark 6 and the second detecting mark 7 are spaced a specified distance "a" and "b" from each other according to a design requirement and are insulated from each other.

Further, the first detection mark 6 and the second detection mark 7 may respectively include connection terminals 8 for applying current. The second detection mark 7 may be partially or all surrounded by the first detecting mark 6.

Detecting marks for detecting a pattern offset amount of exposed regions provided in the embodiments of present invention can used to detect a pattern offset amount by applying current to the first and second detecting marks. If the detecting marks expected to be insulated from each other are insulated from each other, it means that the pattern offset amount of the exposed regions is qualified; if the detecting marks are electrically connected to each other, it means that the pattern offset amount of the two exposed regions is not qualified. The pattern offset amount of exposed processes is detected by using an electrical characteristic, and thus, the detection can be performed rapidly and in real-time, the full detection on a substrate can be achieved, and the defect detection rate and yield can be improved.

As shown in FIG. 7, detecting marks for detecting a pattern offset amount of exposed regions provided in embodiments of present invention include a conductive first detecting mark 1001 and a conductive second detecting mark 1002 which are disposed in pair at a periphery region of exposed regions 101 and 102 in different layers. The first detecting mark 101 and the second detecting mark 102 are located at specified positions in the different layers, and an insulating layer (not shown) is interposed between the first detecting mark 101 and the second detecting mark 102.

Further, the first detection mark 1001 and the second detection mark 1002 may respectively include connection terminals (not shown) for applying a voltage.

Detecting marks for detecting a pattern offset amount of exposed regions provided in embodiments of present invention may detect a pattern offset amount of the exposed regions in different layers by applying a voltage to the first and second detecting marks and determining capacitance difference between the two detecting marks, if a difference between the capacitance and the specified value is within a specified range, it can be determined that a pattern offset amount of two layer is qualified; if a difference between the capacitance and the specified value is out of the specified range, it can be determined that a pattern offset amount of two layer is not qualified. The pattern offset amount of exposed processes can be detected by using an electrical characteristic, and thus, the detection can be performed rapidly and in real-time, the full detection on a substrate can be achieved, and the defect detection rate and yield can be improved.

It should be noted that, the embodiments described above are intended to illustrate but not limit the present invention; although the present invention has been described in detail herein with reference to the above mentioned embodiments, it should be understood by those skilled in the art that the present invention can be modified and some of the technical features can be equivalently substituted without departing from the spirit and scope of the present invention.

What is claimed is:

1. A method for detecting a pattern offset amount of exposed regions in the same layer, comprising:
    forming at least one pair of conductive detecting marks with a predetermined position relationship by a patterning process including two exposing processes;
    detecting an electrical characteristic of the at least one pair of conductive detecting marks, if the detected electrical characteristic does not meet a predetermined position relationship, it is determined that the pattern offset amount of the exposed regions in two exposure steps is not qualified; and if the detected electrical characteristic meets the predetermined position relationship, it is determined that the pattern offset amount of the exposed regions in two exposure steps is qualified;
    wherein the at least one pair of conductive detecting marks are used to detect the pattern offset amount of the exposed regions in the same layer,
    wherein the at least one pair of conductive detecting marks and the exposed regions whose pattern offset is to be detected are respectively formed simultaneously,
    wherein forming at least one pair of conductive detecting marks with a predetermined position relationship by a patterning process including two exposing processes comprises:
    sequentially forming a conductive thin film and a photoresist layer on a substrate; performing a first exposing process to a first region of the photoresist layer and a periphery region of the first region, a first photoresist exposed pattern corresponding to at least one first detecting mark is formed in the periphery region of the first region;
    performing a second exposing process to a second region of the photoresist layer and a periphery region of the second region, a second photoresist exposed pattern corresponding to at least one second detecting mark is formed in the periphery region of the second region, wherein the first photoresist exposed pattern for the first detecting mark and the second photoresist exposed pattern for the second detecting mark are correspondingly disposed in pair and are spaced a specified distance from each other and are not connected to each other; and
    developing the exposed photoresist layer on the substrate to obtain a photoresist mask, and then etching the conductive thin film using the photoresist mask and removing the photoresist mask, and thus the first and second detecting marks formed of the conductive thin film are obtained.

2. The method according to claim 1, wherein detecting an electrical characteristic of the at least one pair of conductive detecting marks comprises:
    performing detection by supplying current to the conductive first and second detecting marks, wherein if the current flows between the first detecting mark and the second detecting mark, it is determined that a pattern offset amount between the first region and the second region is not qualified; and if the first detecting mark and the second detecting mark are insulated from each other, it is determined that the pattern offset amount of between the first region and the second region is qualified.

3. The method according to claim 1, wherein a plurality of first detecting marks are formed and the first detecting marks are electrically connected to one another.

4. The method according to claim 1, wherein a plurality of second detecting marks are formed and the second detecting marks are electrically connected to one another.

5. The method according to claim 1, wherein a plurality of first detecting marks are formed and a portion of the first detecting marks are electrically connected to one another.

6. The method according to claim 5, wherein a plurality of second detecting marks are formed, and the second detecting marks corresponding to the first detecting marks electrically connected to one another are electrically connected to one another.

7. The method according to claim 1, wherein the second detecting mark is surrounded or partially surrounded by the first detecting mark.

8. A detecting mark for detecting a pattern offset amount of exposed regions in the same layer, comprising:
    a conductive first detecting mark and a conductive second detecting mark, disposed in pair at a periphery region of the exposed regions,
    wherein the first detecting mark and the second detecting mark are located in the same layer, and the first detecting mark and the second detecting mark are spaced a specified distance from each other and are insulated from each other, wherein the conductive first detecting mark and the conductive second detecting mark are used to detect the pattern offset amount of the exposed regions in the same layer, wherein the conductive first detecting mark and one of the exposed regions whose the pattern offset is to be detected are formed simultaneously and the conducive second detecting mark and another of the exposed regions whose the pattern offset is to be detected are formed simultaneously, wherein forming at least one pair of conductive detecting marks with a predetermined position relationship by a patterning process including two exposing processes comprises:

sequentially forming a conductive thin film and a photoresist layer on a substrate; performing a first exposing process to a first region of the photoresist layer and a periphery region of the first region, a first photoresist exposed pattern corresponding to at least one first detecting mark is formed in the periphery region of the first region;

performing a second exposing process to a second region of the photoresist layer and a periphery region of the second region, a second photoresist exposed pattern corresponding to at least one second detecting mark is formed in the periphery region of the second region, wherein the first photoresist exposed pattern for the first detecting mark and the second photoresist exposed pattern for the second detecting mark are correspondingly disposed in pair and are spaced a specified distance from each other and are not connected to each other; and developing the exposed photoresist layer on the substrate to obtain a photoresist mask, and then etching the conductive thin film using the photoresist mask and removing the photoresist mask, and thus the first and second detecting marks formed of the conductive thin film are obtained.

9. The detecting mark according to claim 8, wherein the first detecting mark and the second detecting mark each include a connection terminal for applying current.

10. The detecting mark according to claim 8, wherein the second detecting mark is surrounded or partially surrounded by the first detecting mark.

\* \* \* \* \*